United States Patent
Backes (10) Patent No.: US 10,018,661 B2
(45) Date of Patent: Jul. 10, 2018

(54) CAPACITIVE SENSOR, METHOD FOR READING OUT A CAPACITIVE SENSOR FIELD AND METHOD FOR PRODUCING A CAPACITIVE SENSOR FIELD

(71) Applicant: TRW Automotive Electronics & Components GmbH, Radolfzell (DE)

(72) Inventor: Ulrich Backes, Radolfzell (DE)

(73) Assignee: TRW AUTOMOTIVE ELECTRONICS & COMPONENTS GmbH (DE)

( * ) Notice: Subject to any disclaimer, the term of this patent is extended or adjusted under 35 U.S.C. 154(b) by 759 days.

(21) Appl. No.: 14/388,282

(22) PCT Filed: Apr. 2, 2013

(86) PCT No.: PCT/EP2013/056877
§ 371 (c)(1),
(2) Date: Sep. 26, 2014

(87) PCT Pub. No.: WO2013/149992
PCT Pub. Date: Oct. 10, 2013

(65) Prior Publication Data
US 2015/0094974 A1    Apr. 2, 2015

(30) Foreign Application Priority Data

Apr. 2, 2012    (DE) .................. 10 2012 006 546

(51) Int. Cl.
*G01R 27/26* (2006.01)
*G06F 3/044* (2006.01)
(Continued)

(52) U.S. Cl.
CPC ........... *G01R 27/2605* (2013.01); *G01R 3/00* (2013.01); *G06F 3/044* (2013.01); *G09F 9/3023* (2013.01); *Y10T 29/49147* (2015.01)

(58) Field of Classification Search
CPC ..... G06F 3/044; G06F 3/0416; H03K 17/962; H03K 17/955; G01R 27/2605; G01D 5/24; A61B 2562/0214
(Continued)

(56) References Cited

U.S. PATENT DOCUMENTS 4,237,421 A * 12/1980 Waldron .............. H03K 17/962
307/116
4,331,890 A    5/1982 Makino et al.
(Continued)

FOREIGN PATENT DOCUMENTS

DE    202006019926    9/2007
DE    202008007929    10/2008
(Continued)

*Primary Examiner* — Roy Y Yi
*Assistant Examiner* — Jeffrey Aiello
(74) *Attorney, Agent, or Firm* — Tarolli, Sundheim, Covell & Tummino LLP (57) ABSTRACT

A capacitive sensor (20) includes a capacitive sensor field (2), the capacitive sensor field (2) having a plurality of discrete electrodes (4) which are coupled to discrete leads (8). The leads (8) of a first electrode (41) are guided such that they are capacitively coupled with at least one second electrode (42). A first signal (Cm1) is detected at a first lead (8) which is coupled with the first electrode (41), and a second signal (Cm2) is detected at a second lead (8) which is coupled with a second electrode (42). The capacity (Cf1, Cf2) of the first electrode (41) or of the second electrode (42) is determined using a predetermined calculation formula which takes the first signal (Cm1), the second signal (Cm2) and the capacitive coupling between the second electrode (4) and the first lead (8) coupled with the first electrode (41) into account.

12 Claims, 5 Drawing Sheets

(51) Int. Cl.
*G01R 3/00* (2006.01)
*G09F 9/302* (2006.01)

(58) Field of Classification Search
USPC .................. 324/658, 679, 686; 345/173
See application file for complete search history.

(56) References Cited

U.S. PATENT DOCUMENTS

| | | | | |
|---|---|---|---|---|
| 6,469,524 | B1* | 10/2002 | Oberdier | G01D 5/24 324/674 |
| 7,352,355 | B2* | 4/2008 | Troxell | G06F 3/044 178/18.01 |
| 8,698,029 | B2* | 4/2014 | Scuderi | G06F 3/044 200/600 |
| 2006/0192690 | A1 | 8/2006 | Philipp | |
| 2007/0062739 | A1* | 3/2007 | Philipp | G06F 3/044 178/18.06 |
| 2008/0116904 | A1 | 5/2008 | Reynolds et al. | |
| 2008/0202912 | A1 | 8/2008 | Boddie et al. | |
| 2008/0277259 | A1 | 11/2008 | Chang | |
| 2008/0309625 | A1 | 12/2008 | Krah et al. | |
| 2010/0214247 | A1 | 8/2010 | Tang et al. | |
| 2011/0027309 | A1 | 2/2011 | Bottje et al. | |
| 2011/0048813 | A1* | 3/2011 | Yilmaz | G06F 3/044 178/18.06 |
| 2011/0050614 | A1 | 3/2011 | Lin et al. | |
| 2011/0261006 | A1 | 10/2011 | Joharapurkar et al. | |
| 2011/0261008 | A1 | 10/2011 | Joharapurkar et al. | |
| 2011/0267309 | A1 | 11/2011 | Hanauer et al. | |
| 2012/0001838 | A1* | 1/2012 | Tsubata | G02F 1/134336 345/87 |
| 2012/0019478 | A1* | 1/2012 | Bulea | G06F 3/0416 345/174 |
| 2012/0062498 | A1 | 3/2012 | Weaver et al. | |
| 2012/0139866 | A1* | 6/2012 | Jung | G06F 3/0421 345/174 |
| 2013/0030740 | A1* | 1/2013 | Bulea | G06F 3/0416 702/65 |
| 2013/0050139 | A1 | 2/2013 | Gute | |
| 2013/0057299 | A1* | 3/2013 | Unterreitmayer | G01D 3/0365 324/629 |
| 2013/0069921 | A1* | 3/2013 | Saitoh | G09G 3/3659 345/204 |
| 2014/0313169 | A1* | 10/2014 | Kravets | G06F 3/044 345/178 |
| 2015/0301681 | A1 | 10/2015 | Krah et al. | |

FOREIGN PATENT DOCUMENTS

| | | |
|---|---|---|
| DE | 102009057947 | 6/2011 |
| EP | 2339751 | 6/2011 |
| JP | 2011210039 | 11/2011 |
| WO | 2011137200 | 11/2011 |

* cited by examiner

CAPACITIVE SENSOR, METHOD FOR READING OUT A CAPACITIVE SENSOR FIELD AND METHOD FOR PRODUCING A CAPACITIVE SENSOR FIELD

RELATED APPLICATIONS

This application corresponds to PCT/EP2013/056877, filed Apr. 2, 2013, which claims the benefit of German Application No. 10 2012 006 546.9, filed Apr. 2, 2012, the subject matter, of which are incorporated herein by reference in their entirety.

FIELD OF THE INVENTION

The invention relates to a capacitive sensor having an evaluation unit and a sensor field comprising a plurality of discrete electrodes, and to a method of reading out such a capacitive sensor field.

TECHNICAL BACKGROUND

Two-dimensional capacitive sensor fields are in many cases used as control panels (touch pads) for vehicle functions, for example to operate a radio or a navigation system. The capacitive sensor field is preferably arranged in the instrument panel of a motor vehicle and is combined with a display or a mask displaying the corresponding vehicle functions. According to the prior art, such touch pads are produced using relatively thick circuit boards to minimize crosstalk between the leads of the electrodes and the electrodes themselves and to permit an accurate capacity measuring at the respective electrode. The capacity to be measured is generated by the interaction between the respective electrode of the capacitive sensor field and an object lying in an isolated manner on a contact plate and assumed to be grounded, for example a pin specifically provided therefor or the finger of a user. To convert the capacities measured at the electrodes of a capacitive sensor field into appropriate position and/or proximity signals which can be transmitted to the vehicle electronics for further evaluation, a capacitive sensor usually comprises in addition to the sensor field an evaluation unit or evaluation electronics which can of course also be integrated into other electronic components of the vehicle.

The thick circuit boards used to manufacture known sensor fields represent on the one hand a cost factor. On the other hand, a thick and accordingly mechanically rigid circuit board leads to restrictions with respect to the application possibilities of the capacitive sensor field. For example, the adaptation of the sensor field to a desired spatial shape of the touch pad is possible to a limited extent only, without the rigid circuit board having to be adapted already during manufacture to this spatial shape, e.g. to a determined convex or concave surface of the touch pad.

SUMMARY

The object of the present invention is to specify an improved capacitive sensor, an improved method of reading out a capacitive sensor field, and an improved method of manufacturing a capacitive sensor field.

According to one aspect of the invention, a method of reading out a capacitive sensor field is specified, this sensor field having a plurality of discrete electrodes. Each electrode of the capacitive sensor field is coupled to a discrete lead extending from the respective electrode up into a connection area of the sensor field. A capacity of the corresponding electrode can be read out through the respective discrete lead. The plurality of electrodes of the sensor field comprises at least one first electrode the lead of which is guided such that this lead is capacitively coupled with at least one second electrode. A first signal is detected at a first lead coupled with the first electrode, and a second signal is detected at a second lead coupled with the second electrode. The capacity of the first electrode or the capacity of the second electrode is determined by evaluation of a predetermined calculation formula, this calculation formula taking the first signal, the second signal and the capacitive coupling between the second electrode and the first lead coupled with the first electrode into account.

In contrast to the known technical approaches, according to aspects of the invention, the method does not pursue the approach to minimize a capacitive coupling between the leads and the electrodes; it rather consciously accepts this coupling. The inaccuracies thus generated during reading out of the corresponding capacities are arithmetically compensated for by the use of an appropriate calculation formula. It is advantageously possible to dispense with the use of accordingly thick circuit boards to keep crosstalk between the electrode leads and the electrode as low as possible. The calculation formula incorporates, among other things, a capacitive coupling, preferably a capacity between the second electrode and the first lead which is coupled with the first electrode. The capacity between the second electrode and the first lead can be determined empirically, for example. It is however also possible to calculate this capacity on the basis of the geometry used and the materials used (in particular on the basis of the dielectric constant thereof). By consciously accepting a capacitive coupling between the leads of the electrodes and those electrodes in the proximity of which these leads are guided, it is possible to fall back on a plurality of manufacturing techniques for manufacturing an appropriate capacitive sensor field. It is thus for example possible to apply the electrodes and all leads in a layered printing technique by means of conductive or non-conductive paint using appropriate insulating layers. A flexible plastic film, as it is sufficiently thin, can be used as a substrate. This flexible support (substrate) permits an easy adaptation of the shape of the capacitive sensor field to the spatial shape of a control element of a motor vehicle, for example. A control element (touch pad) including the appropriate capacitive sensor field can thus flexibly be adapted to the outer shape of an instrument panel of a motor vehicle and be integrated therein. According to aspects of the invention, such a manufacturing method furthermore offers advantages with respect to the known conventional methods which use relatively thick circuit boards as a substrate.

According to a further aspect of the invention, an advantageous method of reading out a capacitive sensor field is specified, the plurality of electrodes of the sensor field comprising at least one third electrode the lead of which is guided such that this lead is capacitively coupled with the first electrode, the second electrode and, if necessary, with further electrodes. The detection step furthermore comprises in such a method the detection of a third signal at a third lead coupled with the third electrode. If necessary, further signals are detected at further leads which are coupled with the further electrodes. These further leads are capacitively coupled with the third electrode, for example. The capacity of the first, the second or the third electrode is determined by evaluation of an appropriate calculation formula, this calculation formula which is to be respectively determined individually for the first, the second or the third electrode taking the first, the second and the third signal and, if necessary, the further signals at the further leads into account. The calculation formula(s) furthermore incorporate(s) a capacity between the second electrode and the lead of the first electrode, a capacity between the third lead and the first electrode, a capacity between the third lead and the second electrode, and, if necessary, a capacity between the third lead and the further electrodes coupled with this lead. Complex sensor fields can also be reliably read out using such a method.

To determine the calculation formulas mentioned, a linear system of equations can advantageously be formulated which can be solved analytically or numerically and the result of which shows the corresponding calculation formulas for calculating the first, the second and, if necessary, the third capacity. A first, a second and, if necessary, a third equation are present in this linear system of equations for the first, the second and, if necessary, for the third signal. The first up to the third equation is formulated by analyzing the corresponding capacity network of the capacitive sensor. The capacities along a path defined by the corresponding first, second or, if necessary, third lead from the first, second and, if necessary, third electrode up to the output thereof in a corresponding connection area of the sensor field are taken into account here. The capacities appearing in this path are initially the first, the second and, if necessary, the third capacity of the first, the second or, if necessary, of the third electrode. Furthermore, the capacities between the first, the second and, if necessary, the third lead and the electrodes coupled with these leads are taken into account.

According to a further aspect of the invention, a capacitive sensor is specified, which has an evaluation unit and a sensor field comprising a plurality of discrete electrodes. Each of these discrete electrodes is respectively coupled to a discrete lead which extends from the respective electrode up into a connection area. The respective lead is preferably directly electrically connected to the corresponding electrode. The lead is for example directly printed onto the electrode, and the electrode is in this way brought into contact with the lead. The capacity of the respective electrode can be read out through the corresponding lead. The capacitive sensor field comprises at least one first electrode the lead of which is guided such that this lead is capacitively coupled with at least one second electrode. The evaluation unit is designed to detect a first signal at a first lead coupled with the first electrode, and a second signal at a second lead coupled with the second electrode. The capacity of the first electrode or of the second electrode is determined using a calculation formula which is predetermined and preferably stored in the evaluation unit. This calculation formula takes the first signal, the second signal and the capacitive coupling between the second electrode and the lead of the first electrode into account. This calculation formula preferably takes a capacity between the second electrode and the lead of the first electrode into account. As already mentioned, this capacity can be determined both empirically and theoretically on the basis of the geometry and materials used.

Advantageously, the sensor field of the capacitive sensor can furthermore have a plurality of outer electrodes adjoining a connection area of the capacitive sensor field. These outer electrodes are preferably arranged in at least one portion of the periphery of the sensor field. These outer electrodes separate the connection area from a plurality of inner electrodes. The leads of the inner electrodes are guided such that they are capacitively coupled with at least one of the outer electrodes and reach to the connection area preferably arranged at the edge of the sensor field. According to such an embodiment of the capacitive sensor, an inner electrode is a first electrode, and an outer electrode is a second electrode.

The leads of the inner electrodes can furthermore be guided at least across a partial area of a surface of the outer electrodes, the leads of the inner electrode being advantageously separated from the outer electrode by an electric insulating layer. With regard to the flexibility and the costs of the capacitive sensor, it is advantageous if the electrodes, the leads and/or the insulating layer are layers manufactured in a printing process.

According to a further aspect of the invention, a method of manufacturing a capacitive sensor as explained according to the aspects above of the invention is specified. In such a manufacturing method, the discrete electrodes, the electric insulating layer and the leads are applied one after another onto a flexible substrate using a printing process.

Further advantages of the capacitive sensor and of the method of manufacturing such a capacitive sensor according to aspects of the invention have already been mentioned in view of the method according to the invention and are thus not repeated.

DETAILED SPECIFICATION

Figure 1:
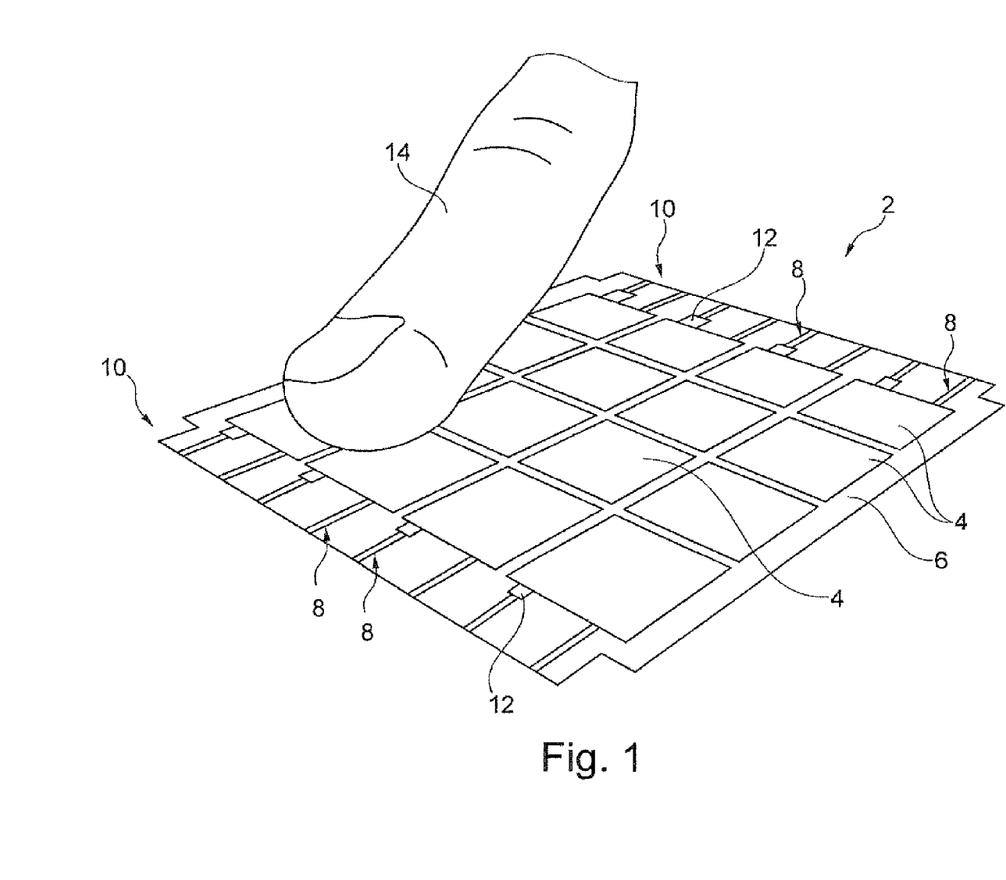
FIG. 1 shows the front side of a capacitive sensor field according to an example embodiment in a simplified perspective view.

FIG. 1 shows a simplified perspective view of the front side of a capacitive sensor field 2 which comprises a plurality of discrete electrodes 4 (for clarity reasons, only some of the electrodes 4 are provided with reference numerals). The electrodes 4 are arranged on a preferably transparent substrate 6 which can be a sufficiently thin and thus flexile plastic film or a thin flexible circuit board, for example.

The electrodes 4 are discrete, i.e. in a plane in which the capacitive sensor field 2 extends, the electrodes 4 are spaced apart and electrically separated from each other. Each of the electrodes 4 is coupled to a lead 8 which is also discrete. This lead 8 is preferably partially printed onto the corresponding electrode 4 and is thus electrically connected or coupled therewith. The lead 8 reaches from the electrode 4 up into a connection area 10 of the capacitive sensor field 2. The leads 8 to those electrodes 4 which do not directly adjoin the connection area 10 are guided across the surface of the electrodes 4 adjoining the connection area 10 and are furthermore electrically separated with respect to the corresponding electrodes 4 by an insulating layer 12. The electrodes 4, the leads 8 and the insulating layers 12 are preferably manufactured in a layered printing process using appropriate conductive or non-conductive paint.

The capacitive sensor field 2 which is preferably integrated into a control panel of a motor vehicle and is for example used to operate a radio or a navigation system is operated by contact with the finger 14 or a pin provided therefor. It is possible to realize a touch pad by combining such a capacitive sensor field 2 with a mask defining for example different control elements, or with a display lying on top. By contact or movement of the finger 14 or of the pin, respectively, predetermined functions can be carried out, for example for adjusting the volume of a radio.

Figure 2:
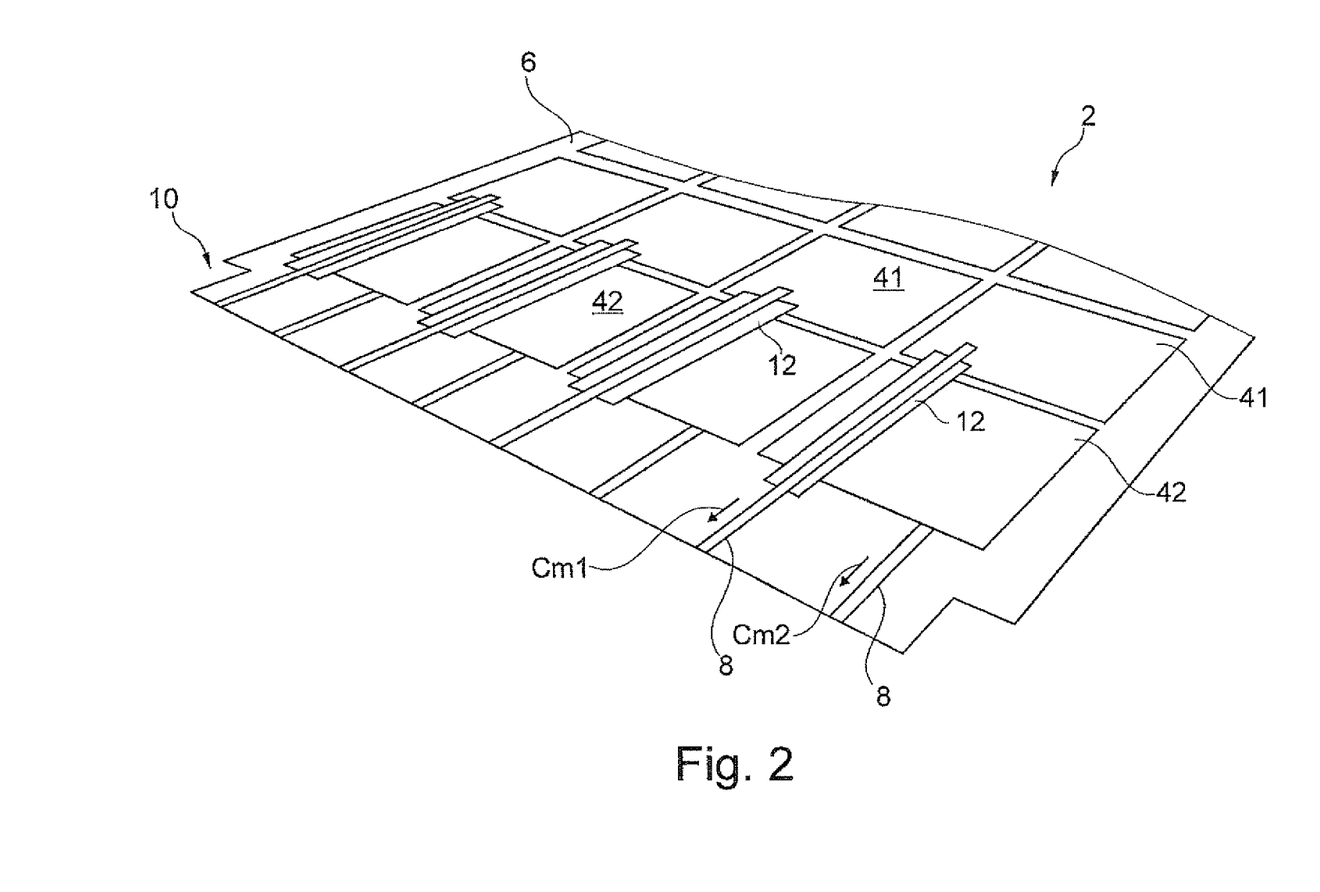
FIG. 2 shows a simplified perspective view of a cutout of this sensor field from its rear side.

FIG. 2 shows the capacitive sensor field 2 already known from FIG. 1 from its rear side in a simplified and perspective cutout view. The capacitive sensor field 2 comprises outer electrodes 42 which directly adjoin the connection area 10. Due to these outer electrodes 42, the inner electrodes 41 arranged in an interior of the capacitive sensor field are separated from the connection area 10 located at the outer edge of the sensor field 2. The leads 8 of the outer electrodes 42 are guided directly into the connection area 10 starting therefrom. In contrast thereto, the leads 8 of the inner electrodes 41 are guided across the outer electrodes 42 into the connection area 10 and are separated from the corresponding outer electrode 42 by an insulating layer 12. Due to this layout of the routing of the leads 8 of the inner electrodes 41, a capacitive coupling is generated between this lead 8 and the corresponding outer electrode 42. The resulting capacity mainly depends on the dimensions of the overlap area between the lead 8 and the outer electrode 42, the thickness of the insulating layer 12, and the material of this insulating layer 12 (in particular the dielectric constant). This inductive coupling is taken into account when evaluating a first and a second signal Cm1 and Cm2. The first signal Cm1 is tapped at a first lead 8 which is connected to an inner electrode 41 also referred to as a first electrode. The second signal Cm2 is tapped at a second lead 8 which is connected to an outer electrode 42 also referred to as a second electrode. A calculation formula taking this capacitive coupling into account and correcting the latter is determined by analyzing the capacitive network present between the leads 8 and the electrodes 4.

Figure 3:
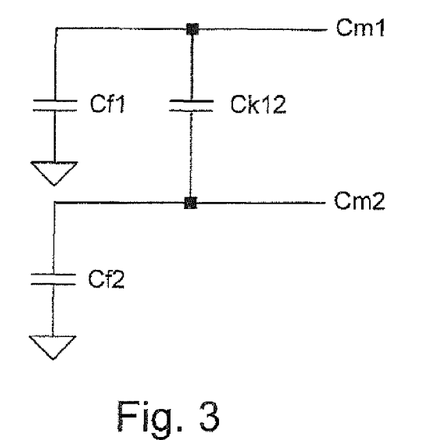
FIG. 3 shows a simplified equivalent circuit diagram for such a sensor field, an inner and an outer electrode being taken into account by way of example.

FIG. 3 shows a simplified equivalent circuit diagram of the capacitive network between the inner and outer electrodes 41, 42 (referred to as first and second electrodes) and the leads 8 thereof. The first signal Cm1 is applied to the first lead which is connected to the first and inner electrode 41. The capacity of the first electrode 41 is referred to as Cf1 and is generated when a finger 14 or a pin assumed to be grounded enters into interaction with this first electrode 41. As the lead 8 to this first and inner electrode 41 is guided across the outer and second electrode 42 the capacity of which is referred to as Cf2 (see FIG. 2), a capacitive coupling is generated between this lead 8 and the outer electrode 42. The capacity between the lead 8 and the second electrode 42 is referred to as Ck12 in the equivalent circuit diagram of FIG. 3.

The second signal Cm2 is detected at a second lead connected to the second and inner electrode 42. The capacity applied to the second and inner electrode 42 changes when the finger 14 or the pin assumed as grounded enters into interaction with this second and inner electrode 42.

It can be taken from the equivalent circuit diagram shown in FIG. 3 that the first signal Cm1 detected at the first lead is determined as follows by the capacities shown in the equivalent circuit diagram:

$$Cm1 = Cf1 + \frac{1}{\frac{1}{Ck12} + \frac{1}{Cf2}}$$

Accordingly, the following dependence on the capacities shown in the equivalent circuit diagram of FIG. 3 is obtained for the second signal Cm2 applied to the second lead:

$$Cm2 = Cf2 + \frac{1}{\frac{1}{Ck12} + \frac{1}{Cf1}}$$

The equations shown for the first and the second signal Cm1, Cm2 form a linear system of equations which can be solved for this quantity to determine the capacity Cf1, Cf2 of the first and the second electrode 41, 42, respectively. For the capacity Cf1 of the first electrode 41, the following calculation formula is obtained:

$$Cf1 = \frac{Cm1}{2} - Ck12 + \sqrt{Cm1 * \left(\frac{Ck12^2}{Cm2} + \frac{Cm1}{1}\right)}$$

The capacity Cf1 of the first electrode 41 can thus be determined on the basis of the first and the second signal Cm1, Cm2 and on the basis of the capacity Ck12 between the second lead 8 which is coupled with the second electrode 42, and the first electrode 41. Accordingly, the following calculation formula applies to the capacity Cf2 of the second electrode 42:

$$Cf2 = \frac{Cm2}{2} - Ck12 + \sqrt{Cm2 * \left(\frac{Ck12^2}{Cm1} + \frac{Cm2}{1}\right)}$$

For a capacitive sensor field 2 in which the leads 8 of the inner electrodes 41 are merely guided across a number of electrodes (more specifically across the outer electrodes 42), the analytical solution represented can be found for determining the corresponding capacities Cf1, Cf2 of the electrodes 41, 42. In case a sensor field 2 however comprises electrodes the leads 8 of which are guided across a multitude of electrodes 4, an analytical solution can usually no longer be found for determining the corresponding capacities of the electrodes 4 so that it is necessary to fall back on numerical methods.

In the following, an exemplary system of equations for a sensor field 2 is to be specified, in which a third electrode 4 is present the lead 8 of which is guided across a first and outer electrode 41 and across an adjoining second and inner electrode 42. At first, an equivalent circuit diagram is obtained in this case which is shown in FIG. 4.

The signals Cm1, Cm2 and Cm3 are detected at a first up to a third lead. As the lead to the third electrode is guided across the first electrode (with the capacity Cf1) and across the second electrode (with the capacity Cf2), the further capacities Ck13 and Ck23 are obtained in addition to the already known capacity Ck12, which result from the capacitive coupling of the lead extending to the third electrode (with the capacity Cf3) with the first electrode (Ck13) and the second electrode (Ck23).

Figure 4:
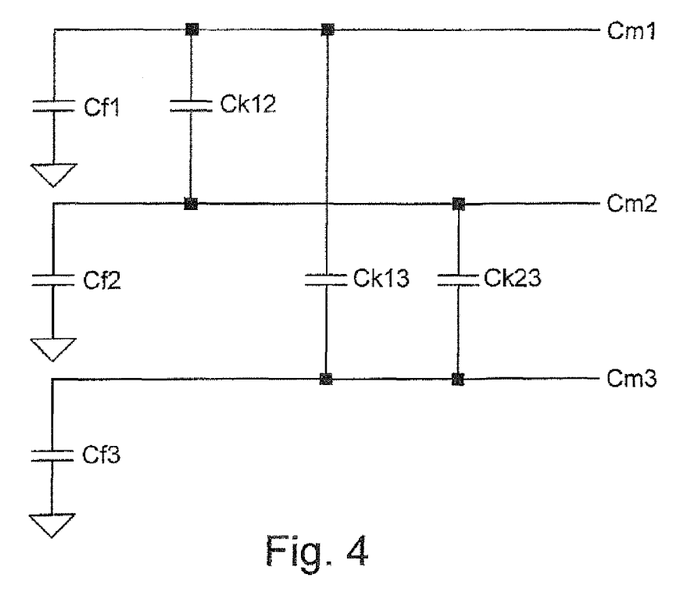
FIG. 4 shows a further simplified equivalent circuit diagram for three exemplary electrodes in a capacitive sensor field the leads of which to the corresponding electrodes are guided across up to two electrodes.

In the capacity network shown in FIG. 4, the following equations which form a linear system of equations can be formulated for the signals Cm1, Cm2 and Cm3 detected at the first up to the third lead:

$$Cm1 = Cf1 + \cfrac{1}{\cfrac{1}{Ck12} + \cfrac{1}{Cf2}} + \cfrac{1}{\cfrac{1}{Ck13} + \cfrac{1}{Cf3}}$$

$$Cm2 = Cf2 + \cfrac{1}{\cfrac{1}{Ck12} + \cfrac{1}{Cf1}} + \cfrac{1}{\cfrac{1}{Ck23} + \cfrac{1}{Cf3}}$$

$$Cm3 = Cf3 + \cfrac{1}{\cfrac{1}{Ck13} + \cfrac{1}{Cf1}} + \cfrac{1}{\cfrac{1}{Ck23} + \cfrac{1}{Cf2}}$$

By a numeric solution of this system of equations, the terms for the first up to the third capacity Cf1, Cf2 and Cf3 can in turn be found, which represent corresponding calculation formulas.

Figure 5:
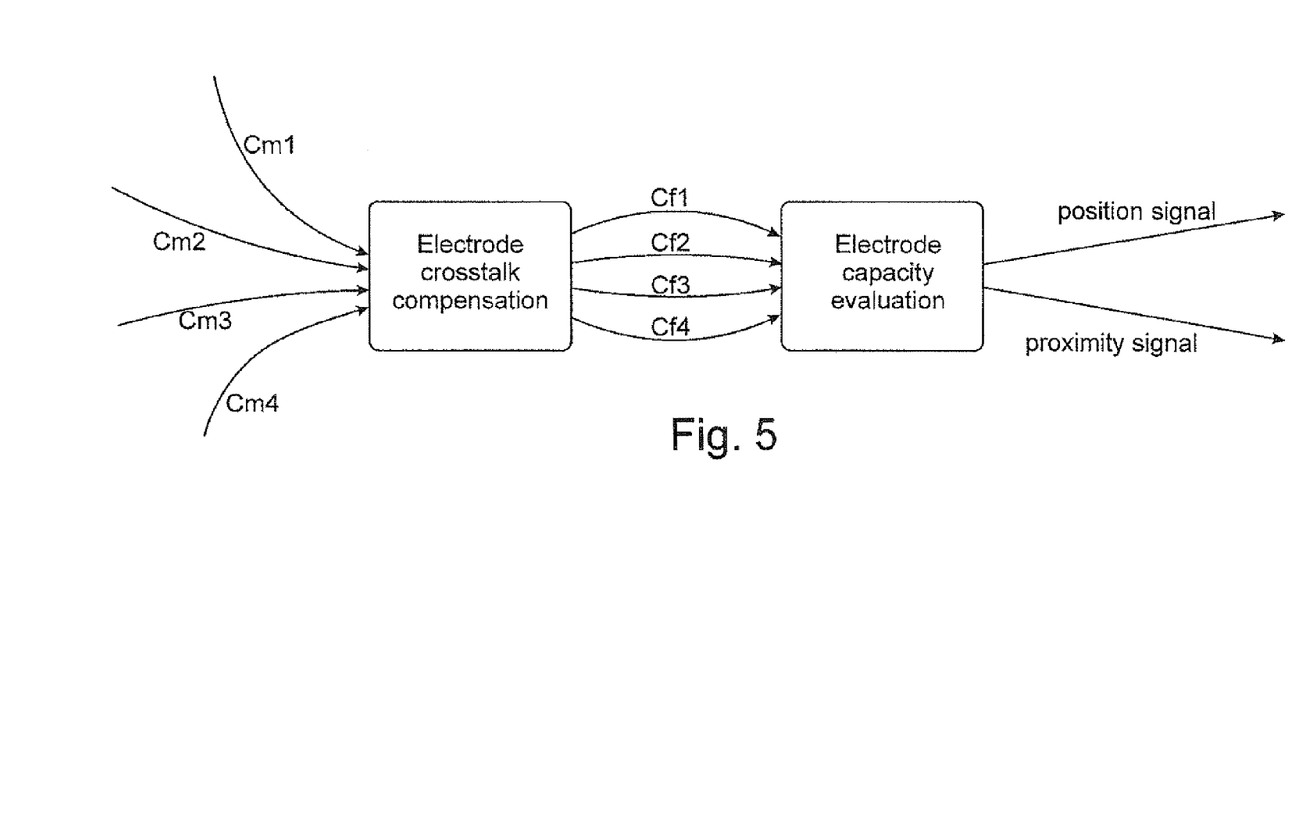
FIG. 5 shows a simplified flow diagram which illustrates a signal processing path in a capacitive sensor according to an example embodiment.

FIG. 5 shows a simplified view of the signal propagation on the basis of the signals Cm1 to Cm4 detected at the leads, which are evaluated in accordance with a method according to aspects of the invention referred to as electrode crosstalk compensation in FIG. 5, so that the capacities Cf1 to Cf4 applied to the corresponding electrodes 4 can be calculated. These capacities Cf1 to Cf4 are evaluated in a further step referred to as electrode capacity evaluation to determine, e.g., the position of the finger 14 on the capacitive sensor field 2 and to carry out a corresponding function on the basis of the position signal or proximity signal output in this step.

Figure 6:
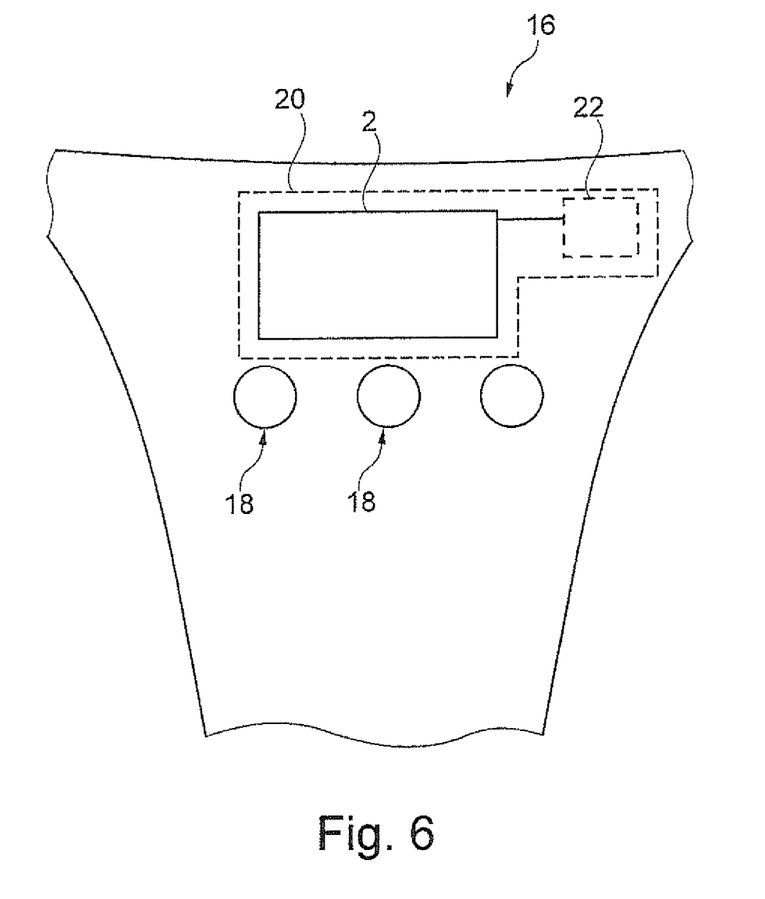
FIG. 6 shows a cutout of a motor vehicle center console in a simplified view into which a capacitive sensor according to an example embodiment is integrated.

FIG. 6 shows a simplified view of a cutout of a center console 16 of a motor vehicle, which comprises a capacitive sensor 20 in addition to different control elements 18. The capacitive sensor 20 comprises a capacitive sensor field 2 and an evaluation unit 22 connected thereto, which is preferably arranged in the interior of the center console 16 (or also at another place of the motor vehicle).

The invention claimed is:

1. A method of reading out a capacitive sensor field (2) having a plurality of discrete electrodes (4), wherein each electrode (4) of the capacitive sensor field (2) is connected with a respective discrete lead (8) which extends from the respective electrode (4) up into a connection area (10) of the sensor field (2) and through which the one capacity (Cf1, Cf2, Cf3) of the respective electrode (4) can be read out, wherein the plurality of electrodes (4) of the sensor field (2) comprises at least one first electrode (4) the lead (8) of which is guided such that the lead (8) is capacitively coupled with at least one second electrode (42), wherein the method of reading out the capacitive sensor field (2) comprises the following steps:
  a) detecting a first signal (Cm1) at a first lead (8) connected with the first electrode (41), and detecting a second signal (Cm2) at a second lead (8) connected with the second electrode (42),
  b) determining the capacity (Cf1, Cf2) of the first electrode (41) or of the second electrode (42) using a predetermined calculation formula which takes the first signal (Cm1), the second signal (Cm2) and the capacitive coupling between the second electrode (42) and the first lead (8) which is coupled with the first electrode (41) into account.

2. The method according to claim 1, wherein the calculation formula incorporates a capacity (Ck12) between the second electrode (42) and the first lead (8) connected with the first electrode (41).

3. The method according to claim 1, wherein the plurality of electrodes (4) of the sensor field (2) comprises at least one third electrode the third lead of which is guided such that this lead is capacitively coupled with the first electrode (41) and the second electrode (42),
  wherein the step of detecting further comprises:
    detecting a third signal (Cm3) at a third lead which is connected with the third electrode, and
  wherein the step of determining a capacity further comprises:
    determining a capacity (Cf1, Cf2, Cf3) of the first, second or third electrode (41, 42) using a calculation formula which takes the first, second and third signal (Cm1, Cm2, Cm3) and the calculation formula further incorporates the capacity (Ck12) between the second electrode (42) and the lead (8) of the first electrode (41), the capacity (Ck13) between the third lead and the first electrode (41), and the capacity (Ck23) between the third lead and the second electrode (42) capacitively coupled with this lead.

4. The method according to claim 3, wherein during the step of determining the first and second capacity (Cf1, Cf2), a corresponding predetermined first and second calculation formula is used, and wherein for determining this calculation formula, a linear system of equations is solved analytically or numerically, this linear system of equations comprising a first and second equation for the first and second signal (Cm1, Cm2), and the respective equation being formulated for a capacity network composed of the first and second capacity (Cf1, Cf2) and the capacities (Ck12) between the first and second lead (8) and the electrode(s) (4) capacitively coupled with the corresponding lead, which occur along a path from the first or second electrode (41, 42) up to an output of the corresponding first or second lead (8) in the connection area (10) of the sensor field (2).

5. The method according to claim 3, wherein the third lead is capacitively coupled with further electrodes,
  wherein the step of detecting further comprises:
    detecting further signals at further leads which are connected with the further electrodes, wherein these further electrodes are capacitively coupled with the lead of the third electrode, and
  wherein the step of determining a capacity further comprises:
    determining a capacity (Cf1, Cf2, Cf2) of the first, second or third electrode (41, 42) using a calculation formula which takes further signals at the further leads into account, wherein the further leads are capacitively coupled with the further electrodes and the calculation formula further incorporates the capacity between the third lead and the further electrodes capacitively coupled with this lead.

6. The method according to claim 4, wherein during the step of determining the third capacity (Cf3), a corresponding predetermined third calculation formula is used, and wherein for determining this calculation formula, a linear system of equations is solved analytically or numerically, this linear system of equations comprising the first, the second, and a third equation for the first, the second, and the third signal (Cm1, Cm2, Cm3) and the respective equation being formulated for the capacity network composed of the first, the second, and the third capacity (Cf1, Cf2, Cf3) and the capacities (Ck12, Ck13, Ck23) between the first, the second, and the third electrode (41, 42) capacitively coupled with the corresponding lead, which occur along the path from the first, second, or third lead up to an output of the corresponding first, or second, or third lead (8) in the connection area (10) of the sensor field (2).

7. A capacitive sensor (20), comprising an evaluation unit (22) and a capacitive sensor field (2) having a plurality of discrete electrodes (4), wherein each electrode (4) is connected with a respective discrete lead (8) which extends from the respective electrode (4) up into a connection area (10) and through which a capacity (Cf1, Cf2) of the respective electrode (4) can be read out, wherein the sensor field (2) comprises at least one first electrode (41) the lead (8) of which is guided such that the lead (8) is capacitively coupled with at least one second electrode (42), and wherein the evaluation unit (22) is designed
   a) to detect a first signal (Cm1) at a first lead (8) which is connected with the first electrode (41), and a second signal (Cm2) at a second lead (8) which is connected with the second electrode (42), and
   b) to determine the capacity (Cf1, Cf2) of the first electrode (41) or of the second electrode (42) using a calculation formula, the first signal (Cm1) and the second signal (Cm2) and the capacitive coupling between the second electrode (42) and the lead (8) of the first electrode (41) being taken into account in this predetermined and stored calculation formula.

8. The capacitive sensor (20) according to claim 7, wherein a capacity (Ck12) between the second electrode (42) and the lead (8) of the first electrode (41) is taken into account in the calculation formula.

9. The capacitive sensor (20) according to claim 7, wherein the capacitive sensor field (2) comprises a plurality of outer electrodes (41) adjoining the at least one connection area (10) of the sensor field (2), and a plurality of inner electrodes (42) which are separated from the connection area (10) by the outer electrodes (41) and which are arranged in an interior of the sensor field (2), wherein the leads (8) of the inner electrodes (42) are guided such that they are capacitively coupled with at least one of the outer electrodes (41) and are guided to the connection area (10) arranged at the outer edge of the sensor field (2), and wherein the first electrode is one of the inner electrodes (41) and the second electrode is one of the outer electrodes (42).

10. The capacitive sensor (20) according to claim 9, wherein the leads (8) of the inner electrodes (42) are guided at least across a partial area of a surface of the outer electrodes (41) and the leads (8) are separated from the inner electrodes (42) by an electric insulating layer (12).

11. The capacitive sensor (20) according to claim 10, wherein the electrodes (4), the leads (8) and/or the insulating layer (12) are layers manufactured in a printing method.

12. A method of manufacturing a capacitive sensor according to claim 7, wherein the discrete electrodes (4), the electrical insulating layer (12) and the leads are applied one after another onto a flexible substrate using a printing method.

* * * * *